United States Patent [19]

Carlson

[11] 4,035,661
[45] July 12, 1977

[54] ELECTRONIC TIMER
[75] Inventor: Gerald L. Carlson, Birmingham, Ala.
[73] Assignee: University of Alabama in Birmingham, Birmingham, Ala.
[21] Appl. No.: 677,229
[22] Filed: Apr. 15, 1976

Related U.S. Application Data

[63] Continuation of Ser. No. 483,547, June 27, 1974, abandoned.
[51] Int. Cl.² .......................................... H01H 7/00
[52] U.S. Cl. ................................. 307/141; 328/130
[58] Field of Search ............ 307/141, 141.4, 141.8, 307/293; 134/579; 259/1; 340/309.1, 309.4, 147 P; 328/129, 130

[56] References Cited
U.S. PATENT DOCUMENTS

| | | | |
|---|---|---|---|
| 3,464,673 | 9/1969 | Cargo et al. .............................. | 259/1 |
| 3,477,258 | 11/1969 | Walker et al. ...................... | 307/141 |
| 3,539,153 | 11/1970 | Wennerberg et al. .............. | 307/141 |
| 3,639,844 | 2/1972 | Karklys .................................. | 259/1 |
| 3,774,056 | 11/1973 | Sample et al. ...................... | 307/293 |
| 3,783,651 | 1/1974 | Karklys .............................. | 68/12 R |
| 3,790,815 | 2/1974 | Karklys .............................. | 307/141 |
| 3,819,906 | 6/1974 | Gould, Jr. ....................... | 340/147 P |
| 3,840,752 | 10/1974 | Eshraghin ...................... | 340/147 P |

Primary Examiner—David Smith, Jr.
Attorney, Agent, or Firm—C. A. Phillips

[57] ABSTRACT

An electronic timer for selectively timing the occurrence of electrically controllable events. The relative time spacing of events to be timed is stored or programmed in a memory by proportional storage in memory locations. This having been accomplished, execution of the program is effected by means of a selectable rate pulse generator which interrogates the memory. At those locations where positive data is stored, there results an output which is employed to perform a switching function.

10 Claims, 2 Drawing Figures

ELECTRONIC TIMER

This is a continuation of application bearing Ser. No. 483,547, filed June 27, 1974 now abandoned

BACKGROUND OF THE INVENTION

1. Field of the Invention

This invention relates to timing devices, and particularly to a device of this catagory which may be readily programmed and operated to control randomly timed-spaced physical switching functions.

2. General Description of the Prior Art

Timing devices, electronic and mechanical, typically employ some form of device which linearly measures time, such as by counting pulses of an oscillator, and when a count of a selected number representative of a preselected passage of time is reached, a switching function is performed. Such timers are ideal for the performance of simple operations such as the performance of a single switching function. There appears, however, a real need for a timer which will perform multiple switching functions at randomly selected times and yet not be complex or expensive.

SUMMARY OF THE INVENTION

It is, accordingly, the object of the present invention to provide a new and improved electronic timer which is capable of producing multiple switching events with near infinitely selectable timed-spacing between events, yet is relatively inexpensive, and may be programmed without any special expertise.

GENERAL SYSTEM

Figure 1:
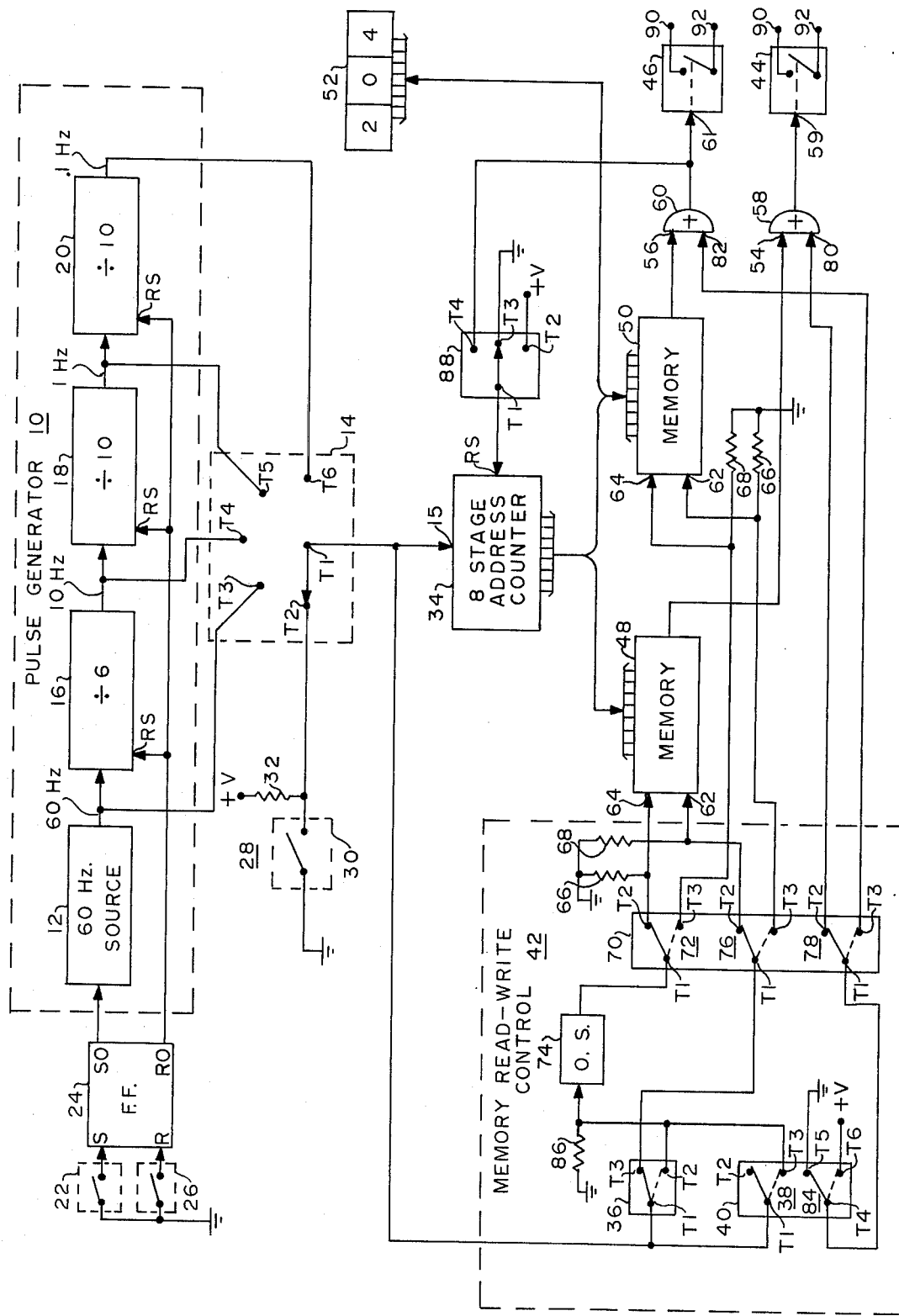
FIG. 1 is an electrical block diagram of an embodiment of the invention.

The timer of this invention is adapted to time the operation of devices in turn controllable by electrically-operated actuators such as switches, relays, or solenoids. For purposes of illustration, two actuators are shown, switches 44 and 46, and it is assumed that these swiches are of a type which turn on responsive to a sequence of applied input pulses. Each switch is connected to the data output of one of two 256 bit programmable digital memories 48 and 50. The memories are programmed and read out by means of binary outputs of eight stage address counter 34. The output of address counter 34 is also connected to display 52 upon which addressed memory locations are displayed and may be observed to assist use of the timer. A discrete operating time is programmed in a memory by means of the application of a "1" bit written in a particular location. Once so programmed, and by operation of pulse generator 10 to provide pulses at a selected rate, the stored bits are read from memory to operate one or both of switches 44 and 46 to provide one or two series of programmed operations responsive to these swiches.

CLOCK PULSE GENERATOR

Timing pulses are generated by clock pulse generator 10 which provides output pulses at selected rates. The basic rate is 60 Hz per second, and this is provided by a conventional 60 Hz pulse source 12. Its output is coupled to contract T3 of selector switch 14 from which it is made available from movable contact T1.

The 60 Hz signal is also applied to divide by six divider 16, and its output is connected to contact T4 of selector switch 14 and to the input of decade counter 18. The output of divider 18 is coupled to contact T5 of switch 14 and to the input of decade counter 20. The output of counter 20 is coupled to contact T6. Thus, there is selectively made available at movable contact T1 pulse outputs spaced 1/60 of a second, 1/10 of a second, one second, and 10 seconds apart.

Pulse generator 10 is started by closing "start" switch 22 which operates flip flop 24 to a "set" condition, causing an enable output from the SO terminal to be applied to and turn on 60 Hz source 12. Operation of the pulse generator is stopped by closing "stop" switch 26 which resets flip flop 24 and provides an RO output to the reset RS input of the dividers to reset each of them to a zero state. To facilitate programming of the timer, negative pulses may be generated by manual pulse generator 28 which consists of switch 30, resistor 32, and a ground source connected across switch 30 and resistor 32, one terminal of resistor 32 being connected to a positive voltage. Contact T2 of swich 14 is connected to the interconnection of switch 30 and resistor 32, and there appears a negative pulse on contact T2 each time that switch 30 is closed. It is hereinafter referred to as a "step" switch.

The output of pulse generator 10, which appears on contact T1 of switch 14, is coupled as a count input signal to input 15 of eight stage binary address counter 34 (for a total count of 256) and as a read-write signal to movable arm T1 of "write 0" switch 36 and to movable arm T1 of contact of "write 1" switch 40 of memory control 42.

MEMORIES

Each of memories 48 and 50 is conventional and has eight address input lines which are connected to the output of address counter 34. Data ouputs of the memories are connected to inputs 54 and 56 of OR gates 58 and 60, respectively. The outputs of these gates are in turn connected to the control inputs 59 and 61 of switches 44 and 46, respectively. Each memory includes a "data in" input 62 and "read-write" input 64, which are normally referenced to a common ground by resistors 66 and 68. In order to write a "1" bit in a selected location, "data in" input 62 is made positive and a positive pulse is applied to "read-write" input 64. Information thus loaded in the memories is presented at the inputs of OR gates 58 and 60. Assuming sequential "ones" are written in a memory, there results a continuous output because when the memory is sequentially addressed, the present output decays after the next output is selected.

MEMORY READ-WRITE CONTROL

Information is loaded into a selected memory by triple-pole, double-throw memory select switch 70. Read-write inputs of the memories 48 and 50 are connected to stationary terminals T2 and T3, respectively, of contacts 72, the movable arm T1 of this set of contacts being connected to the output of one shot 74. The "data in" inputs of memories 48 and 50 are in turn connected to terminals T2 and T3, respectively, of contacts 76, the movable arm T1 of which is connected to terminal T3 of "write 0" switch 36. Terminals T2 an T3 of contacts 78 of switch 70 are connected to inputs 80 and 82 of OR gates 58 and 60, respectively, and movable arm T1 is connected to the movable arm T4 of contacts 84 of double-pole, double-throw "write 1" switch 40. Movable arms T1 of switch 36 and of contacts 38 of switch 40 are also connected to movable contact T1 of selector switch 14, which is further connected to count input 15 of binary address counter 34. Stationary contacts T3 and T2 of switches 40 and 36, respectively, are connected together and to the input of one shot 74, which is referenced to ground through resistor 86. Contact T4 of switch 40 is connected to movable arm T1 of contacts 78 of memory select switch 70. Stationary contacts T5 and T6 of switch 40 are connected to common ground and a positive voltage source, respectively.

ADDRESS COUNTER RESET

Prior to storing a program or executing a program stored in either of memories 48 and 50, address counter 34 is reset by single-pole, triple-throw switch 88 to address the first location of a memory. Movable arm T1 of this switch is connected to reset input RS of the address counter and is normally positioned as shown wherein it is connected through contact T3 to common ground. Reset is effected by connecting arm T1 through lower contact T2 to a positive voltage source or through the upper contact T4 to a output of OR gate 60, as will be further explained.

OPERATION

Before loading a timing program into a memory, matter previously stored in that memory must be erased. This is accomplished by writing a zero in each memory location as follows:

1. Memory select swich 70 of memory read-write control 42 is positioned to select one of the memories, memory 48, as shown. Address counter 34 is then reset by momentarily positioning the arm of reset switch 88 down to apply a positive potential and then moving it back to the position shown. This selects the first location of an addressed memory.

2. Movable arm T1 of selector swich 14 is positioned to contact terminal T3 of switch 14.

3. Momentary "write 0" switch 36 of program control 42 is operated to the dotted line position which connects the output of 60 Hz clock 12 through contacts T3 and T1 of switch 14 to step input 15 of address counter 34 and through contacts T1 and T2 of switch 36 to the input of one shot 74.

4. Start switch 22 is operated to set control flip flop 24 and thus start 60 Hz clock source 12. Since location 0 of memory 48 is now selected by address counter 34, a first positive pulse at the output of source 12 triggers one shot 74, applying a positive pulse to "read-write" input 64 of memory 48 and therefore writes a zero in location 1 in memory 48. The trailing edge of this clock pulse steps address counter 34 up by one count, selecting location 2 of memory 48. The second and each subsequent clock pulse writes a zero in a memory location and then steps counter 34 to the next location of that memory. In this manner, after approximately four seconds (256 pulses), all zeroes are written in memory 48.

5. Stop switch 26 is operated to stop clock pulse generator 10, and a reset output of flip flop 24 resets cascaded dividers 16, 18, and 20 to a zero condition.

Assume now that the system is to be programmed to operate some device as follows: on for 10 seconds, off for 20 seconds, on for 10 seconds, and then finally turned off. It will be further assumed that the device to be controlled is connected to switch 44 and that switch 44 is closed for each output pulse and remains closed for any sequential group of output pulses. The initial state of switch 44 is assumed to be open or "off", as shown. The programming steps are as follows.

1. Movable arm T1 of selector switch 14 is positioned to contact T2 which connects switch 30 as a "step" function to address counter 34. Switch 30 thus enables a memory to be programmed or loaded as slowly as desired.

2. With address counter 34 set to zero and thus the first location, location "0" of memory 48 addressed, "write 1" switch 40 of memory control 42 is operated to the dotted line position to connect switch contact T1 to the input of one shot 74.

3. This applies a positive pulse through terminals T1 and T3 of "write 1" switch 40 to trigger one shot 74. A positive voltage is applied through contacts T1 and T3 of "write 0" switch 36 to the "data in" input 62 of memory 48.

By the foregoing steps, a "1" is written in memory location "0", representing the time of the first step of the program. Assuming that a clock pulse readout rate for effecting the program of one pulse per second is to be employed, address counter 34 would next be stepped by switch 30 to an indicated memory location, a "1" being written in each of memory locations 0 through 9 inclusive, by leaving "write 1" switch 40 in an "on" condition. A "0" bit is present in locations 10 through 29. "Write 1" switch 40 is returned to the original position, as shown. Step switch 30 is then operated to advance through locations 10 through 29. By manipulating switches 30 and 40 in this same manner, the program is completed by writing "1" bits in locations 30 through 49, "0" bits in locations 50 through 89, and "1" bits in locations 90 through 99. A "0" is loaded in location 100 to terminate the sequence. This process is assisted by reference to display 52 which displays the number of each memory location as it is addressed.

Once the complete program is stored in memory 48, address counter 34 is reset by reset switch 88, and movable arm T1 of selector switch 14 is positioned to contact T5 which connects the one pulse per second of pulse generator 10 to the step input of counter 34 and to memory control 42. Finally, contacts 90 and 92 of switch 44 are connected to the device to be controlled, and the programmed timed control of the device may be effected. This is done by operating start switch 22, thus starting 60 Hz source 12.

The trailing edge of each 1 CPS pulse steps address counter 34 by one step and addresses the next sequential location of memory 48. In this manner, each location of memory 48 (0 through 9) is read or sensed with a resulting "1" or true output in each instance. When location 10 of memory 48 is interrogated, memory 48 outputs a "0" or "turn off" signal to switch 44. As a result, switch 44 opens and remains open for the next 20 one-second pulses, and then at locations 30, memory 48 outputs another "1" by virtue of the "1" bit previously loaded into this location, and switch 44 is caused to close. It then remains closed for 20 seconds since "1" bits are written in locations 30 through 49, incusive. In a similar manner, each location of memory 48 is interrogated, and the appropriate "on" or "off" function is executed at each location where a "1" bit or "1" bit, respectively, has been previously loaded in the memory. At location 100 of memory 48, the desired sequence of operational events has been completed, and switch 44 is opened, and the timing sequence is repeated at a count of 257.

The system is reset for further use by resetting pulse generator 10 and address counter 34. Thus, stop switch 26 would be closed to reset control flip flop 24, which disables 60 Hz source 12 and applies a reset pulse to each of clock dividers 16, 18, and 20, resetting them to zero. Address counter 34 is reset by operating movable arm T1 of reset of switch 88 down to contact T2 and returning it to the position shown. When these steps have been taken, the timing sequence stored in memory 48 may be repeated, or, employing procedures outlined above, a new program inserted in one of the memories.

The program stored in one memory may be repeatedly read out by programming the other memory to detect the final operation of the stored program in the first memory. Thus, assuming the program referred to above has been stored in memory 48, automatic repetition of the timing program may be effected as follows.

1. Memory select switch 70 of memory read-write control 42 is positioned to the dotted line position which connects inputs 62 and 64 of second memory 50 to the appropriate output of memory read-write control 42.

2. Movable contact T1 of selector switch 14 is operated to engage contact T2, connecting step switch 30 to the input of address counter 34 and memory read-write control 42.

3. Address counter 34 is reset to zero by operation of switch 88, selecting location 1 of memory 50.

4. Memory 50 is first cleared of any previous information, and then switch 30 is repeatedly operated to step address counter 34 to a count of 100, corresponding to the address of the last stored event in memory 48. This function may also be performed by setting switch 14 for a convenient output pulse rate from pulse generator 10 and thus automatically stepping address counter 34. In either case, this operation is aided by reference to decode and display 52 which indicates the count in address counter 34 and thus the memory location addressed.

5. "Write 1" switch 40 of memory read-write control 42 is operated to the dotted line position, and thus a "1" bit is written in location 100 of memory 50.

6. Reset switch 88 is positioned to the upper contact position to connect the reset input RS of address counter 34 to the output of OR gate 60.

The timer is now set for repetition of the programmed sequence stored in memory 48. Upon the initiation of 60 Hz source 12, one-second spaced pulses from divider 18 will be coupled through switch 14 to count input 15 of address counter 34. As these pulses occur, each location of each of memories 48 and 50 will be selected. Thus, memory 48 will provide outputs to perform the switching function previously described for it until address 100 is reached. Coincident with the resulting last output from memory 48, the interrogation of memory 50 at location 100 produces an output pulse by virtue of the "1" previously stored in it. The leading edge of this pulse resets address counter 34 by virtue of an output applied through OR gate 60 and contacts T1 and T4 of reset switch 88. Thus, location 1 of each of memories 48 and 50 is selected by an output of address counter 34, and thereafter upon the occurrence of the next pulse output from decade divider 18, switch 44 is energized by a "1" bit located in memory 48 to begin the programmed series of switching events again. The sequence will then be performed repeatedly until it is terminated by closing "stop" switch 26.

It is to be appreciated that any series of events may be performed at a faster or slower rate, determined by the setting of selector switch 14. Thus, a whole program may be proportionately curtailed or enlarged.

In addition to pre-programming the timer as described, programming may be effected while actually performing switching functions, as when actually turning on and off an apparatus in use. In such case, the following steps would be observed.

1. Memory select switch 70 would be positioned to select one of the memories, for example, memory 48, positioned as shown.

2. Selector switch 14 is positioned to one of the contact positions (T3, T4, T5, or T6) to select an appropriate timing sensitivity or accuracy for timing events and a timing span to cover the entire switching sequence. For example, we will assume that sufficient accuracy may be achieved with a plus or minus five seconds sensitivity and that a total switching sequence can be completed within the total timing capacity of address counter 34 of 42 ⅔ minutes with switch 14 set to the T6 position. Thus, with switch 14 thus positioned, start switch 22 is closed, starting pulse generator 10.

3. The first switching function may be performed thereafter in 10 seconds, and we will assume that it requires that switch 44 be closed for five minutes. Thus, just prior to the elapse of this period, write switch 40 would be closed. By this operation, a plus voltage is applied through contacts 84 of "write 1" switch 40 to input 80 of OR gate 58 to close switch 44, and thus perform the first switching step of the switching sequence. Coincident with this operation and with the receipt of the first pulse output of decade divider 20, this pulse output is coupled through the contacts of write switch 40 to trigger one shot 74 and thus write a "1" in memory 48. Thus, a first switching command is recorded in memory 48 and at a reference time which is ten seconds after the closure of start switch 22. Write switch 40 would remain on for the next 29 sequential ten-second spaced pulses, each of which would write a "1" bit in the next 29 locations of memory 48 as selected by address counter 34. In this manner, an initial switch closure time of five minutes is stored in the memory. Thereafter, in the same manner, "on" and "off" commands would be effected by operation of switch 40 until a desired sequence of switching events is completed. When this is accomplished, the program will have been recorded.

To effect timed repetition of the programmed switching events as described above, it is simply necessary to program the timer for playback as previously described. Likewise, in the event that it is desired to cause repeated operation of the program, this may be accomplished by employing memory 50 to reset address counter 34 and thus automatically repeat operations in the manner described.

Figure 2:
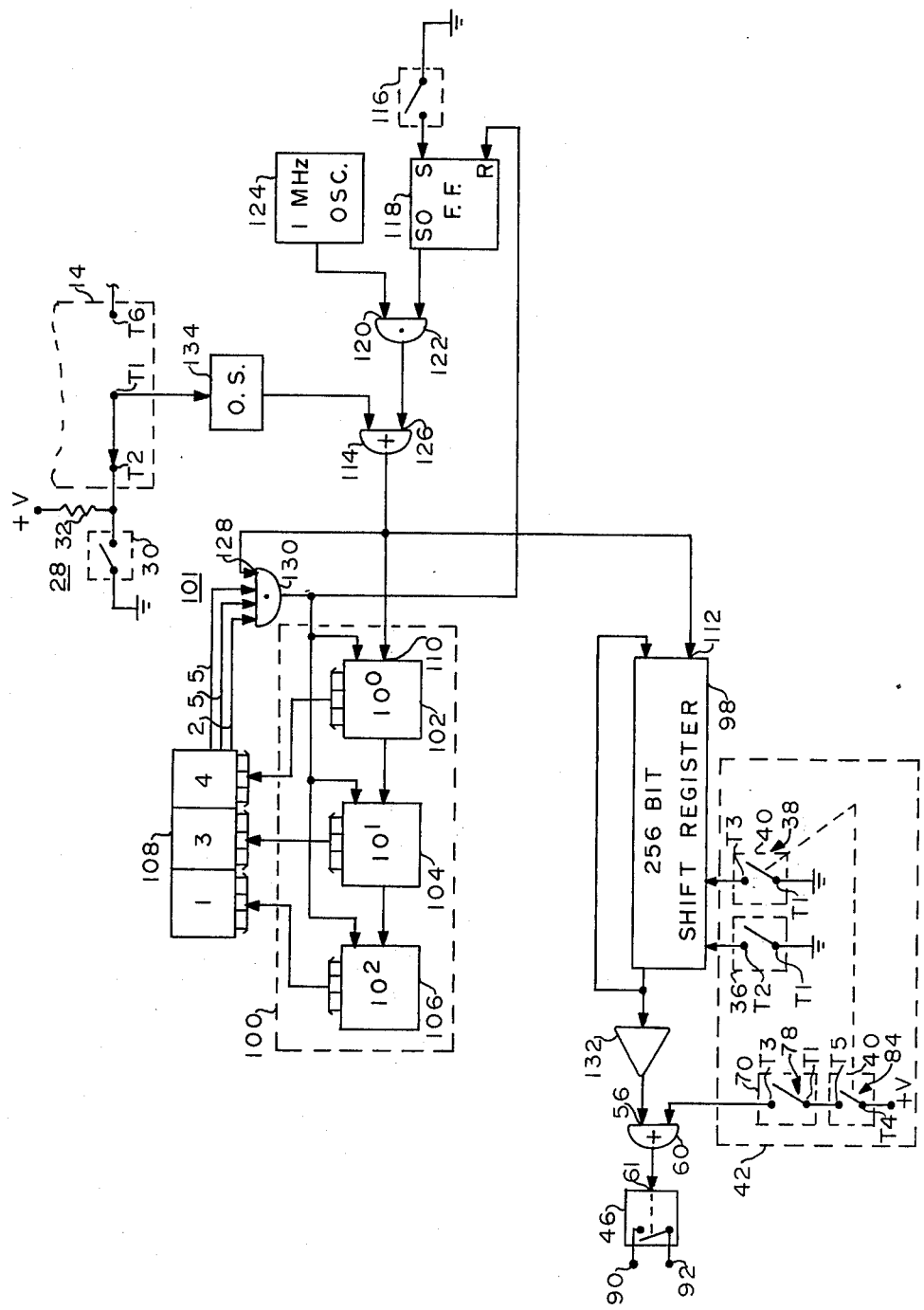
FIG. 2 is an electrical block diagram of an alternate embodiment.

FIG. 2 shows an alternate embodiment of the invention which, as illustrated, utilizes a 256 bit recirculating shift register 98 as a temporary storage of binary information. An associated decade counter 100 is provided with a feedback circuit 101 which enables the decade counter to produce the same number of counts as the bits contained in shift register 98. The B.C.D. outputs of decades 102, 104, and 106 are coupled to decode and display 108 which provides a digital readout of a count contained in decade counter 100. Count input 110 of decade counter 100 and the shift clock input 112 of shift register 98 are connected together and are coupled to the output of OR gate 114. Accordingly, each time information is shifted by one stage in shift register 98, decade counter 100 is stepped up by one count. In this manner, a binary program or sequence may be stored in shift register 98 in accordance with the counts read out by display 100. Further, the sequence may be started at a zero time reference and recalled in the identical order as stored in register 98. Once power is supplied to the system, and before information is inserted in shift register 98, reset switch 116 is closed, changing flip flop 118 to a "set" state, and its "set" output enables input 120 of AND gate 122. Pulses are then supplied from 1 MHz oscillator 124 through AND gate 122 to one input 126 of OR gate 114. They then pass on to count input 110 of decade counter 100 to input 128 of AND gate 130 and to shift clock input 112 of shift register 98. Decade counter 100 steps up to a count of 255, whereupon AND gate 130 becomes primed; and upon the occurrence of the next clock pulse at input 128, an output of AND gate 130 resets flip flop 118 and resets decade counter 100 to zero count. Digital readout 108 now reads 000, and the final stage of shift register 98 becomes in effect the first memory location. Pulses may then be selectively applied through selector switch 14, either from step switch 30 or from the output of a selected divider of pulse generator 10 (FIG. 1).

Information is stored in shift register 98 by write switch 40, which simply applies a "set" pulse to the final stage of shift register 98. To erase information stored in register 98, erase switch 36 is operated, which applies a reset pulse to the final stage of shift register 98. In this manner, a "1" or "0" may be written at any one of 256 locations of shift register 98. Electronic switch 46 is closed in response to any "1" which is shifted into the final stage of shift register 98, being coupled through buffer amplifier 132 and input 56 of OR gate 60 to input 61 of switch 46.

It is readily seen that switch 40 may be manually operated to perform a series of operations which are then recorded in register 98. The thus recorded operations may then be performed at a rate as determined by the position of selector switch 14 in a similar manner to that described with respect to the embodiment shown in FIG. 1.

For purposes of illustration of operation, it is assumed that it is desired to asynchronously program shift register 98 to perform a certain series of events. Accordingly, reset switch 116 would be operated to first reset decade counter 100 to a zero condition. Selector switch 14 would then be positioned as shown in FIG. 2 wherein T1 is connected to contact T2, and thus stepping pulses and shift pulses are supplied by switch 30. These pulses trigger one shot 134, which in turn outputs a pulse through OR gate 114 to simultaneously shift the information in shift register 98 and count decade counter 100 up by one count. Accordingly, when the counter is reset to 000, location 1 in memory is now represented by the last stage of register 98. Assuming, it is desired to store a "1" corresponding to the zero count of counter 100, write switch 40 is operated to "set" the final stage of shift register 98. Step switch 30 is then operated one time, which steps decade counter 100 up by one count and shifts the information stored in the final stage of register 98 to the first stage of register 98. The second memory location is now available at the end of shift register 98, and either a "1" or "0" may be written in this location by operating the "write 1" or "write 0" switch 36, respectively, to inject the proper information in shift register 98. In this manner, a complete series of events is loaded into shift register 98.

To automatically perform the programmed operation, reset switch 116 would again be operated to set flip flop 118 and gate 1 MHz pulses to shift register 98 and decade counter 100. Accordingly, location 1 of shift register 98 is selected. Start switch 22 (FIG. 1) would then be operated to enable an output from clock generator 10, and thus feed pulses at a selected rate through selector switch 14 which shifts the information in shift register 98 and steps counter 100 up by one count for each pulse. Once the counter reaches a full count of 255, AND gate 130 is primed, and the next clock pulse resets counter 100.

What is claimed is:

1. An electronic timer comprising:
    pulse generating means for providing at a selected rate a train of evenly spaced, in time, pulses;
    memory means comprising:
        a plurality of storage locations accessible at an even rate in a fixed order of succession,
        loading means responsive to input pulses for serially loading, in the order of said succession, data bits in at least any two said storage locations, and
        readout means coupled to said storage locations and responsive to evenly spaced, in time, pulses from said pulse generating means for successively accessing, one storage location per pulse, in said fixed order of succession and providing pulse outputs from those of said storage locations in which data bits are stored, said pulse outputs thus being spaced in time in accordance with the position in sequence of the storage locations in which data bits are stored, and in accordance with the rate of said input pulses;
    address means coupled to said memory means and responsive to said train of pulses from said pulse generating means for referencing the position in said memory means of at least one of said locations of said memory means; and
    actuating means responsive to an output of said readout means for controlling work.

2. An electronic timer as set forth in claim 1 wherein said pulse generating means includes means for generating a single pulse.

3. An electronic timer as set forth in claim 1 wherein said address means includes counting means for counting a total count at least equal to the number of said storage locations in said memory means, and includes indicating means for indicating the count state of said counting means.

4. An electronic timer as set forth in claim 3 wherein:
    said memory means comprises a recirculating shift register; and
    said address means includes gating means responsive to a maximum count of said counting means for resetting said counting means and said shift register, whereby said counting means and said shift register are synchronized.

5. An electronic timer as set forth in claim 1 wherein:
    said memory means comprises an address input for each location;

said loading means includes means responsive to an input applied to one of said address inputs for loading a data bit in a discrete said location;

said readout means includes means responsive to an input applied to one of said address inputs for providing an output corresponding to the data state of a discrete location; and said address means comprises counting means responsive to said train of pulses for progressively providing, as an output count pulse, each discrete count pulse being coupled to a discrete said address input for a said memory location of said memory means.

6. An electronic timer as set forth in claim 4 further comprising display means connected to the output of said address means for registering the count ouput of said means.

7. An electronic timer as set forth in claim 6 wherein said actuating means comprises an electrical switch.

8. An electronic timer as set forth in claim 1 further comprising at least one additional said memory means and at least one additional said actuating means, said additional actuating means being responsive to said additional memory means.

9. An electronic timer as set forth in claim 8 further comprising means for selectively writing and reading from one of said memories.

10. An electronic timer as set forth in claim 8 further comprising means responsive to an output for one of said memory means for resetting said address means to a reference address position with respect to a said memory means.

* * * * *